(12) United States Patent
Galton

(10) Patent No.: US 6,476,748 B1
(45) Date of Patent: Nov. 5, 2002

(54) METHOD AND APPARATUS FOR CYCLIC RETURN TO ZERO TECHNIQUES FOR DIGITAL TO ANALOG CONVERTORS

(75) Inventor: Ian Galton, Del Mar, CA (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/839,051

(22) Filed: Apr. 20, 2001

(51) Int. Cl.[7] ............................................. H03M 1/66
(52) U.S. Cl. ........................ 341/144; 341/68; 341/69
(58) Field of Search ............................ 341/144, 68, 69

(56) References Cited

U.S. PATENT DOCUMENTS

| | | | |
|---|---|---|---|
| 4,639,619 A | | 1/1987 | Baldwin et al. |
| 5,521,946 A | * | 5/1996 | Main .......................... 375/350 |
| 5,610,606 A | * | 3/1997 | Fukunaga et al. .......... 341/143 |
| 5,684,482 A | * | 11/1997 | Galton ........................ 341/144 |
| 6,061,010 A | * | 5/2000 | Adams et al. ............... 341/144 |
| 6,266,002 B1 | * | 6/2001 | Gong et al. ................. 341/150 |

* cited by examiner

*Primary Examiner*—Michael Tokar
*Assistant Examiner*—Khai Nguyen
(74) *Attorney, Agent, or Firm*—Blakely, Sokoloff, Taylor & Zafman LLP

(57) ABSTRACT

This invention relates generally to methods and apparatuses for implementing cyclic return to zero techniques for digital to analog (D/A) conversion. Generally, embodiments of the invention disclose techniques for generating low-distortion continuous-time output waveforms in digital-to-analog converters (DACs) wherein the transient errors are not correlated with the DAC input signal, thereby resulting in DACs with significantly reduced nonlinear distortion. In one embodiment, a cyclic return to zero (CRTZ) digital to analog converter (DAC) includes at least two return to zero (RTZ) signal generating circuits, e.g. RTZ sub-DACs, to perform D/A conversion and a cycler, e.g. an RTZ sub-DAC cycler, to cycle between the two RTZ sub-DACs. The RTZ sub-DAC cycler cycles between the two RTZ sub-DACs such that one of the RTZ sub-DACs is active to perform D/A conversion for at least an entire sample period while the other RTZ sub-DAC is inactive.

53 Claims, 10 Drawing Sheets

METHOD AND APPARATUS FOR CYCLIC RETURN TO ZERO TECHNIQUES FOR DIGITAL TO ANALOG CONVERTORS

BACKGROUND

1. Field of the Invention

This invention relates generally to the field of digital to analog conversion. In particular, the invention relates to implementing cyclic return to zero techniques for digital to analog converters.

2. Description of Related Art

Ideally, a digital-to-analog converter (DAC) with a continuous-time output (e.g., a zero-order-hold output as opposed to a switched-capacitor output) converts an input signal, represented as a sequence of digital numbers, into an analog output waveform, represented as a time-varying voltage or current, without introducing any error. However, practical DACs introduce error consisting of random noise, linear distortion, and nonlinear distortion. The term noise is generally used to denote error that is not correlated with the DAC input signal, the term linear distortion is generally used to denote error that is linearly related to the input signal, and the term nonlinear distortion (also called harmonic distortion) is generally used to denote error that is nonlinearly related to the input signal.

In high precision DACs with continuous-time outputs, the overall DAC error is often dominated by nonlinear distortion. However, in many applications, such as high-fidelity audio systems and transmitters for wireless communications, nonlinear distortion of a given power is more problematic than noise and linear distortion of comparable power. Unfortunately, to avoid introducing nonlinear distortion it is not only necessary for the DAC output to settle to the correct output level by the end of each sample period, but the transient associated with the settling process must not contain nonlinear distortion. In many high-performance DACs with continuous-time outputs, nonlinear transient settling behavior is the dominant source of nonlinear distortion.

For example, assume x[n] represents the digital input sequence to a given DAC, and assume y(t) represents the continuous-time analog output waveform generated by the DAC in response to x[n]. Since x[n] is a discrete-time sequence, and y(t) is a continuous-time function, a DAC performs interpolation to convert the sequence of discrete numbers into a continuous-time waveform. A common type of interpolation used is zero-order-hold interpolation, which sets $y(t)=\alpha x[n]+\beta$ during each sample interval, i.e., during $nT \leq t<(n+1)T$ for each integer n, where $\alpha$ is a constant scale factor, $\beta$ is a constant offset, and T is the sample period of the input sequence. In this case, during each sample interval, y(t) is held constant at a level which, neglecting the constant offset, is proportional to the corresponding discrete value of the input sequence. At the end of each sample interval, i.e., at each time (n+1)T, the output waveform abruptly jumps to the level corresponding to the next input sample value, i.e., $\alpha x[n+1]+\beta$.

Since no physical device can generate a truly discontinuous waveform, zero-order-hold interpolation is an idealization; i.e. practical DACs can only approximate the zero-order-hold behavior. Therefore, a transient error waveform can be defined as the difference between the actual interpolation function implemented by the DAC and ideal zero-order-hold interpolation. In many DACs, it is also possible to define a discrete error sequence that represents errors not associated with the interpolation process such as often arise from component mismatches. Therefore, in general the output of the DAC is given by $$y(t)=\alpha x[n]+\beta+e_d[n]+e_t(t),\ nT \leq t<(n+1)T, \qquad (1)$$

for each value of n, where $e_d[n]$ is the discrete error and $e_t(t)$ is the transient error. Well known techniques such as dynamic element matching can be used to reduce nonlinear distortion contributed by the discrete error sequence of the DAC if necessary. Therefore, to simplify the presentation the discrete error sequence is ignored or assumed to be zero throughout much of the patent. To further simplify the presentation, the DAC offset, $\beta$, is assumed to be zero without loss of generality.

FIG. 1 provides a comparison between representative continuous-time output waveforms from an idealized DAC with ideal zero-order-hold interpolation, and from a typical practical DAC that only approximates zero-order-hold interpolation. More particularly, FIG. 1 shows representative continuous-time DAC output waveforms: the top waveform 102 corresponds to ideal zero-order-hold interpolation, the middle waveform 104 represents the approximate zero-order-hold interpolation typically implemented by practical DACs, and the bottom waveform 106 represents the transient error between the actual and ideal interpolations. The bottom waveform 106 is the transient error associated with the practical DAC; i.e. it is the difference between the top and middle waveforms 102 and 104, respectively. As is illustrated in FIG. 1, a the transient error consists of a train of transient pulses each of which starts at the beginning of a sample period and asymptotically approaches zero. It should be noted that if the discrete error sequence were not zero, the transient pulse originating in the $n^{th}$ sample period would asymptotically approach $e_d[n]$. Therefore, the transient error can be written in the form:

$$e_t(t) = \sum_{n=-\infty}^{\infty} p_n(t - nT), \qquad (2)$$

Where $p_n(t)$ is the transient pulse associated with the $n^{th}$ sample interval. Typically, $p_n(t)$ is causal, has a peak at t=0, and has a shape that depends nonlinearly on both the $(n-1)^{th}$ and $n^{th}$ DAC input samples.

As discussed previously, it is desirable to avoid having the transient error introduce nonlinear distortion. Therefore, it is undesirable to have a nonlinear relationship between the transient pulses and the DAC input values. In general, it is not possible to eliminate the transient pulses, but it is possible to design a DAC with transient error that consists of uniformly shaped and spaced transient pulses each of which is scaled by the corresponding input sequence sample. To the extent that this is done, nonlinear distortion is eliminated from the transient error. Two prior art methods of achieving this result will now be discussed.

Both of the prior art methods involve multiple one-bit DACs, i.e., DACs whose inputs are one-bit sequences, which are combined to yield a composite multi-bit DAC. FIG. 2 is a block diagram illustrating an exemplary composite DAC 200 comprising eight one-bit DACs $202_1-202_8$ and summing operation 206 that can be utilized in implementing the two prior art methods. The overall DAC input, x[n], is a sequence of 4-bit numbers each of which is restricted to the set $\{-4, -3, -2, -1, 0, 1, 2, 3, 4\}$. It is assumed that the four input bits in FIG. 2 have weights −4, 2, 1, and 1, respectively, which can be thought of as a conventional 3-bit two's complement number with an extra least-significant bit. A digital logic block, such as digital encoder 204, converts each input sample to a unity weighted 8-bit number representation in which the value of each bit is taken to be ½ when the bit is high and −½ when the bit is low. The digital encoder 204 selects the 8 bits such that the sum of the resulting bit values is equal to x[n]. For example, if x[n]=2, the digital encoder sets six of the bits labeled $x_i$[n] in FIG. 2 high, and the remaining two bits low. It can be verified that if each one-bit DAC performs ideal zero-order-hold interpolation with an output value of Δ/2 when the input bit is high and −Δ/2 when the input bit is low, then the overall DAC is an ideal zero-order-hold DAC with an output that ranges from −4Δ to 4Δ in steps of Δ. Alternatively, if x[n] is restricted to the range {0, 1, . . . , 8}, the digital encoder sets x[n] of its output bits high and the rest of its output bits low, and the two possible output levels of each one-bit DAC are 0 and Δ, then the overall DAC has an output that ranges from 0 to 8Δ in steps of Δ.

In such composite DACs, e.g. composite DAC 200, the two sources of nonlinear distortion in the transient error are the one-bit DACs $202_1$–$202_8$ and the analog summing operation 206. Although the summing operation 206 does introduce nonlinear distortion, such distortion can be minimized through the use of one-bit DACs with current-mode (i.e., high impedance) outputs such that the outputs can be summed by connecting them all to a low impedance load or a low impedance amplifier input. Therefore, in the following it is assumed that the summing operation does not introduce significant nonlinear distortion.

Further, it is assumed that the following two conditions hold for the composite DAC 200: 1) if presented with equivalent input all of the one-bit DACs $202_{1-2028}$ would introduce identical transient pulses, and 2) the transient pulse introduced by each one-bit DAC $202_1$–$202_8$ in a given sample interval does not depend on the one-bit DAC's input values during past or future sample intervals. In other words, suppose that the $n^{th}$ transient pulse introduced by each one-bit DAC $202_1$–$202_8$ is $p_h$(t−nT) if the DAC input bit is high or $p_l$(t−nT) if the DAC input bit is low, where $p_h$(t) and $p_l$(t) are arbitrary but are common to all the one-bit DACs. For the composite DAC 200 with an arbitrary number, say N, of one-bit DACs, at the $n^{th}$ sample time x[n] of the one-bit DACs have their input bits set high and N−x[n] have their input bits set low. Therefore, it follows from the original transient error equation (2) and the two conditions above that the transient error is given by:

$$e_t(t) = \sum_{n=-\infty}^{\infty} Np_l(t-nT) + x[n][p_h(t-nT) - p_l(t-nT)]. \quad (3)$$

The functions $p_h$(t) and $p_l$(t) do not depend on x[n], so this equation (3) indicates that the transient error is linearly related to x[n]; only linear distortion is introduced. Therefore, the two conditions stated above are sufficient to avoid nonlinear distortion in the transient error.

Known circuit layout and dynamic element matching techniques can be used to achieve the first of these conditions to a high degree of accuracy. However, it can be verified that the second condition is violated if one-bit DACs that approximate zero-order-hold interpolation are used.

The first prior art technique that avoids this problem uses one-bit DACs that implement an alternate type of interpolation known as return-to-zero (RTZ) interpolation. The idea behind RTZ interpolation is to perform zero-order-hold interpolation, or an approximation thereof, for only a portion (typically half) of each sample period, and to zero the output for the remainder of the sample period. In this way, the output of each one-bit DAC starts from zero at the beginning of every sample period, thereby eliminating the dependence of the transient pulses on previous one-bit DAC input values.

FIG. 3 provides a comparison between idealized and practical output waveforms for a one-bit DAC example that illustrates a practical (i.e., physically realizable) approximation to RTZ interpolation. More particularly, FIG. 3 is a signal diagram showing representative continuous-time output waveforms from a one-bit digital to analog converter (DAC) with ideal zero-order-hold interpolation (top waveform 300), from a practical one-bit DAC utilizing return to zero (RTZ) interpolation (middle waveform 302), and the transient error associated with the practical one-bit RTZ DAC (bottom waveform 304). The top plot 300 shows the output of a one-bit DAC with ideal zero-order-hold interpolation as a reference, and the middle plot 302 shows the corresponding practical version of RTZ interpolation. As is evident in FIG. 3, the RTZ output 302 approximates zero-order-hold interpolation for the first half of each sample interval and then settles to zero for the remainder of the sample interval. The bottom plot 304 shows the transient error which is the difference between the top and middle plots 300 and 302, respectively. Each transient pulse now consists of two components: the first component peaks at the start of the sample interval and settles to zero, and the second component starts half way through and persists to the end of the sample interval. Nevertheless, as is evident from FIG. 3 and which tends to be true in general, the transient pulse in a given sample interval is not a function of previous or future one-bit DAC input samples. Therefore, the second condition above is satisfied by one-bit DACs that implement practical RTZ interpolation.

In summary, the first prior art technique limits nonlinear distortion in the transient error introduced by composite DACs of the type shown in FIG. 2 through the use of current mode one-bit DACs that implement practical RTZ interpolation in conjunction with known circuit layout and dynamic element matching techniques to promote good matching among the one-bit DACs. In the following, the first prior art technique is referred to as the basic RTZ technique.

Unfortunately, the basic RTZ technique has three drawbacks. The first drawback is that nonlinear distortion is reduced relative to DACs that perform zero-order-hold interpolation at the expense of significantly increased linear distortion. As mentioned above, RTZ interpolation gives rise to a second component in each transient pulse. As illustrated in FIG. 3, this component occupies half of the sample interval and has a peak magnitude equal to that of the one-bit DAC output waveform, i.e., Δ/2. Therefore, the power of the resulting transient error in the overall DAC output is comparable to that of the desired signal component. As explained above, the error is linear distortion which is generally preferable to nonlinear distortion. Nevertheless, it is still error and can be problematic in many applications, especially at such a high power level relative to the de sired signal component. The second drawback is that only half of each sample period is used by the one-bit DACs to generate the signal component of the overall DAC. To avoid introducing nonlinear distortion, each one-bit DAC must fully settle to zero in the second half of each sample period. Consequently, the approach requires one-bit DAC circuitry with approximately twice the speed of what would be necessary if the whole sample interval could be used for the settling process. The third drawback is that an additional timing signal is required to cause the one-bit DACs to begin the return-to-zero process half way through each sample interval. Most often, this necessitates a clock signal at twice the sample frequency.

The second prior art technique avoids the first drawback mentioned above. It is based on the idea of implementing each one-bit DAC as a pair of interleaved one-bit RTZ sub-DACs. Hence, it is referred to as the dual-RTZ technique. Representative waveforms are shown in FIG. 4 for the same one-bit DAC input sequence as in the basic RTZ example shown in FIG. 3.

FIG. 4 is a signal diagram showing representative continuous-time output waveforms from a pair of first and second interleaved RTZ sub-DACs utilizing a dual RTZ technique (top and middle waveforms, 400 and 402, respectively) and their sum (bottom waveform 404). The top plot 400 represents the output waveform of a first RTZ sub-DAC, and the middle plot 402 represents the output waveform of a second RTZ sub-DAC. The bottom plot 404 is the output of the dual-RTZ one-bit DAC obtained by summing the two outputs from the RTZ sub-DACs. Each RTZ sub-DAC in isolation is equivalent to a one-bit DAC in the basic RTZ technique described above, so its output contains only linear distortion. Therefore, there only can be linear distortion in the dual-RTZ one-bit DAC output (e.g., the bottom plot 404), because it is the sum of the two RTZ sub-DAC outputs. Consequently, the dual-RTZ technique offers the same advantage with respect to limiting nonlinear distortion as does the basic RTZ technique. However, the amount of linear distortion introduced by the dual-RTZ technique in the overall DAC output is greatly reduced relative to that of the basic RTZ technique, because each RTZ sub-DAC tends to cancel the large second transient pulse component of the other RTZ sub-DAC. As a result, the dual-RTZ one-bit DAC output waveform, e.g., the bottom plot 404, is a much better approximation to ideal zero-order-hold interpolation than the outputs of either of the RTZ sub-DACs in isolation.

Therefore, like the basic RTZ technique, the dual-RTZ technique limits nonlinear distortion in the transient error from composite DACs of the type shown in FIG. 2. However, unlike the basic RTZ technique, it does not introduce excessive linear distortion in the transient error, so it avoids the first drawback of the basic RTZ technique described above. Nevertheless, it is subject to the second two basic RTZ technique drawbacks described above: each RTZ sub-DAC in the dual-RTZ technique has the same settling requirements as in the basic RTZ technique and a timing signal is necessary to trigger the on and off portions of each RTZ sub-DAC.

SUMMARY OF THE INVENTION

The invention is briefly summarized by the claims that follow below. This invention relates generally to methods and apparatuses for implementing cyclic return to zero techniques for digital to analog conversion. Embodiments of the invention provide the benefits achieved by the basic RTZ and dual-RTZ techniques, discussed previously, with respect to limiting nonlinear distortion in the transient error, but are not subject to the previously discussed drawbacks associated with these techniques. Generally, embodiments of the invention disclose techniques for generating low-distortion continuous-time output waveforms in digital-to-analog converters (DACs) wherein the transient errors are not correlated with the DAC input signal, thereby resulting in DACs with significantly reduced nonlinear distortion.

In one embodiment, the invention discloses a method for performing cyclic return to zero (CRTZ) digital to analog conversion by generating at least two RTZ signals for performing digital to analog conversion. The method cycles between two RTZ signal generating circuits such that one of the RTZ signal generating circuits is active (i.e., converts a digital input bit into analog form) over at least an entire sample period generating an active signal (i.e., has not returned or is not returning to zero) while the other RTZ signal generating circuit returns to approximately zero or other approximately constant value (i.e., it becomes inactive) for the entire sample period. During the next period, the cycling occurs between the two RTZ signal generating circuits such that the RTZ signal generating circuit that was active during the previous sample period now returns to approximately zero or other approximately constant value and the other RTZ signal generating circuit that returned to approximately zero or other approximately constant value during the previous sample period becomes active. In contrast to the dual-RTZ technique, the RTZ waveforms in this method are not simply shifted versions of each other.

In other embodiments of the invention, a cyclic return to zero (CRTZ) digital to analog converter (DAC) includes at least two RTZ signal generating circuits, e.g. RTZ sub-DACs, to perform digital to analog conversion and a cycler, e.g. an RTZ sub-DAC cycler, to cycle between the two RTZ sub-DACs. The RTZ sub-DAC cycler cycles between the two RTZ sub-DACs such that one of the RTZ sub-DACs performs digital to analog conversion for an entire sample period while the other RTZ sub-DAC returns to approximately zero or other approximately constant value for the entire sample period. During the next period, the RTZ sub-DAC cycler switches between the two RTZ sub-DACs such that the RTZ sub-DAC that performed the digital to analog conversion during the previous sample period returns to approximately zero or other approximately constant value and the other RTZ sub-DAC that returned to zero or other approximately constant value during the previous sample period performs the digital analog conversion. In this fashion, each RTZ sub-DAC starts from approximately zero or an approximately constant value when converting an input bit to analog form and utilizes an entire sample period (in contrast to the dual-RTZ technique in which the RTZ sub-DACs zero their outputs part way through each sample period).

In further embodiments of the invention, at least three RTZ sub-DACs are utilized in either a random or a multi-period fashion. For example, a random RTZ sub-DAC cycler can be used to cycle between three RTZ sub-DACs in a random fashion. In yet another embodiment, a multi-period RTZ sub-DAC cycler can be used to cycle between three RTZ sub-DACs such that each RTZ sub-DAC holds its output value for at least two sample periods before returning to approximately zero or other approximately constant value. These and other embodiments will be discussed in further detail later.

Other features and advantages of the present invention will be set forth in part in the description which follows and the accompanying drawings, wherein the preferred embodiments of the present invention are described and shown, and in part will become apparent to those skilled in art upon examination of the following detailed description taken in conjunction with the accompanying drawings, or may be learned by the practice of the present invention. The advantages of the present invention may be realized and attained by means of the instrumentalities and combinations particularly pointed out in the appended claims.

BRIEF DESCRIPTION OF THE DRAWINGS

The features and advantages of the present invention will become apparent from the following description of the present invention in which.

DETAILED DESCRIPTION

This invention relates generally to methods and apparatuses for implementing cyclic return to zero techniques for digital to analog conversion. Generally, embodiments of the invention disclose techniques for generating low-distortion continuous-time output waveforms in digital-to-analog converters (DACs) with significantly reduced nonlinear distortion.

In the following description, the various embodiments of the present invention will be described in detail. However, such details are included to facilitate understanding of the invention and to describe exemplary embodiments for implementing the invention. Such details should not be used to limit the invention to the particular embodiments described because other variations and embodiments are possible while staying within the scope of the invention. Furthermore, although numerous details are set forth in order to provide a thorough understanding of the present invention, it will be apparent to one skilled in the art that these specific details are not required in order to practice the present invention. In other instances details such as, well-known methods, procedures, components, electrical structures and circuits, are not described in detail, or are shown in block diagram form, in order not to obscure the present invention. Furthermore, aspects of the invention will be described in particular embodiments but may be implemented in hardware, software, firmware, middleware, or a combination thereof.

Figure 5:
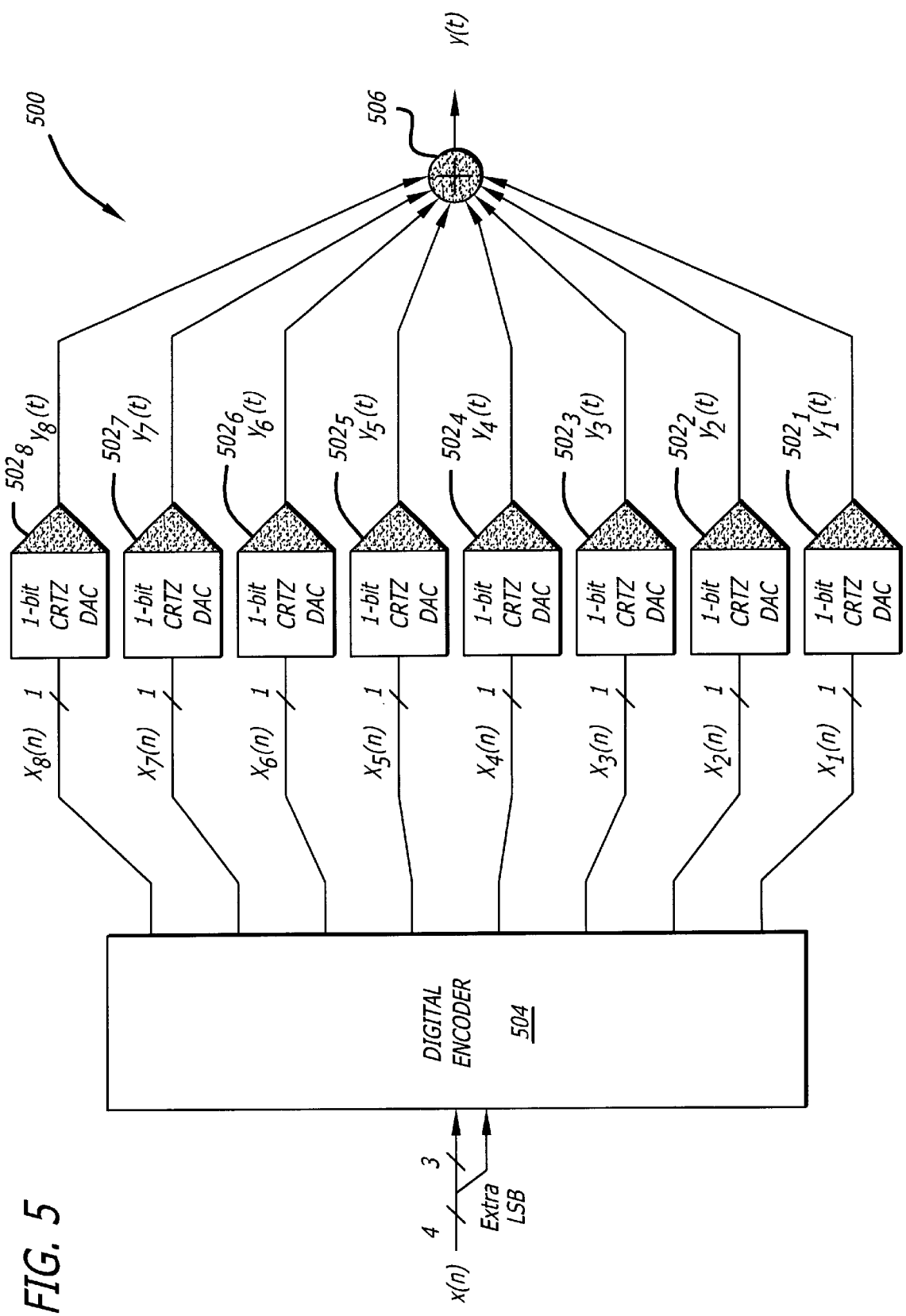
FIG. 5 is a block diagram illustrating an exemplary composite DAC in which embodiments of the present invention related to cyclic return to zero (CRTZ) techniques can be practiced.

FIG. 5 is a block diagram illustrating an exemplary composite CRTZ DAC 500 in which embodiments of the present invention related to cyclic return to zero (CRTZ) techniques can be practiced. FIG. 5 illustrates an exemplary composite CRTZ DAC 500 comprising eight CRTZ one-bit DACs $502_1$–$502_8$ and summing operation 506, which can be utilized in implementing the CRTZ techniques. It should be appreciated that this is only an example of an environment in which the embodiments of the invention can be practiced and should not be used to limit the invention. For example, a composite DAC of any number of one-bit DACs can be used (e.g., a composite DAC consisting of N one-bit DACs). Additionally, it is also possible to practice the invention with composite DACs consisting of multiple one-bit DACs with different relative weightings of their output step sizes.

In this example, composite CRTZ DAC 500 includes eight one-bit CRTZ DACs $502_1$–$502_8$, i.e., DACs whose inputs are one-bit sequences, which are combined to yield a composite multi-bit DAC. In the case of an 8-bit composite DAC 500, the overall DAC input, x[n], is a sequence of 4-bit numbers each of which can represent the decimal number set {−4, −3, −2, −1, 0, 1, 2, 3, 4}. It is assumed that the four input bits in FIG. 5 have weights −4, 2, 1, and 1, respectively, which can be thought of as a conventional 3-bit two's complement number with an extra least-significant bit. A digital logic block, such as digital encoder 504, converts each input sample to a unity weighted 8-bit number representation in which the value of each bit is taken to be ½ when the bit is high and −½ when the bit is low. The digital encoder 504 selects the 8 bits such that the sum of the resulting bit values is equal to x[n]. For example, if x[n]=2, the digital encoder sets six of the bits labeled $x_i[n]$ in FIG. 5 high, and the remaining two bits low. It can be verified that if each one-bit DAC performs ideal zero-order-hold interpolation with an output value of Δ/2 when the input bit is high and −Δ/2 when the input bit is low, then the overall DAC is an ideal zero-order-hold DAC with an output that ranges from −Δ to 4Δ in steps of Δ. Alternatively, if x[n] is restricted to the range {0, 1, . . . , 8}, the digital encoder sets x[n] of its output bits high and the rest of its output bits low, and the two possible output levels of each one-bit DAC are 0 and Δ, then the overall DAC has an output that ranges from 0 to 8Δ in steps of Δ. Again, it should be appreciated that this is only an example of a composite DAC and that embodiments of the invention can be practiced with many other types of composite DACs.

In such composite DACs, e.g. composite CRTZ DAC 500, the two sources of nonlinear distortion in the transient error are the one-bit DACs $502_1$–$502_8$ and the analog summing operation 506. Although the summing operation 506 does introduce nonlinear distortion, such distortion can be minimized through the use of one-bit DACs with current-mode (i.e., high impedance) outputs (to be discussed); such that the outputs can be summed by connecting them all to a low impedance load or a low impedance amplifier input. Therefore, it is assumed that the summing operation does not introduce significant nonlinear distortion. Embodiments of one-bit DACs, the CRTZ DAC, stochastic CRTZ DAC, and multi-period CRTZ DAC, to be discussed, can be implemented with a composite DAC of the type described in FIG. 5.

Figure 6A:
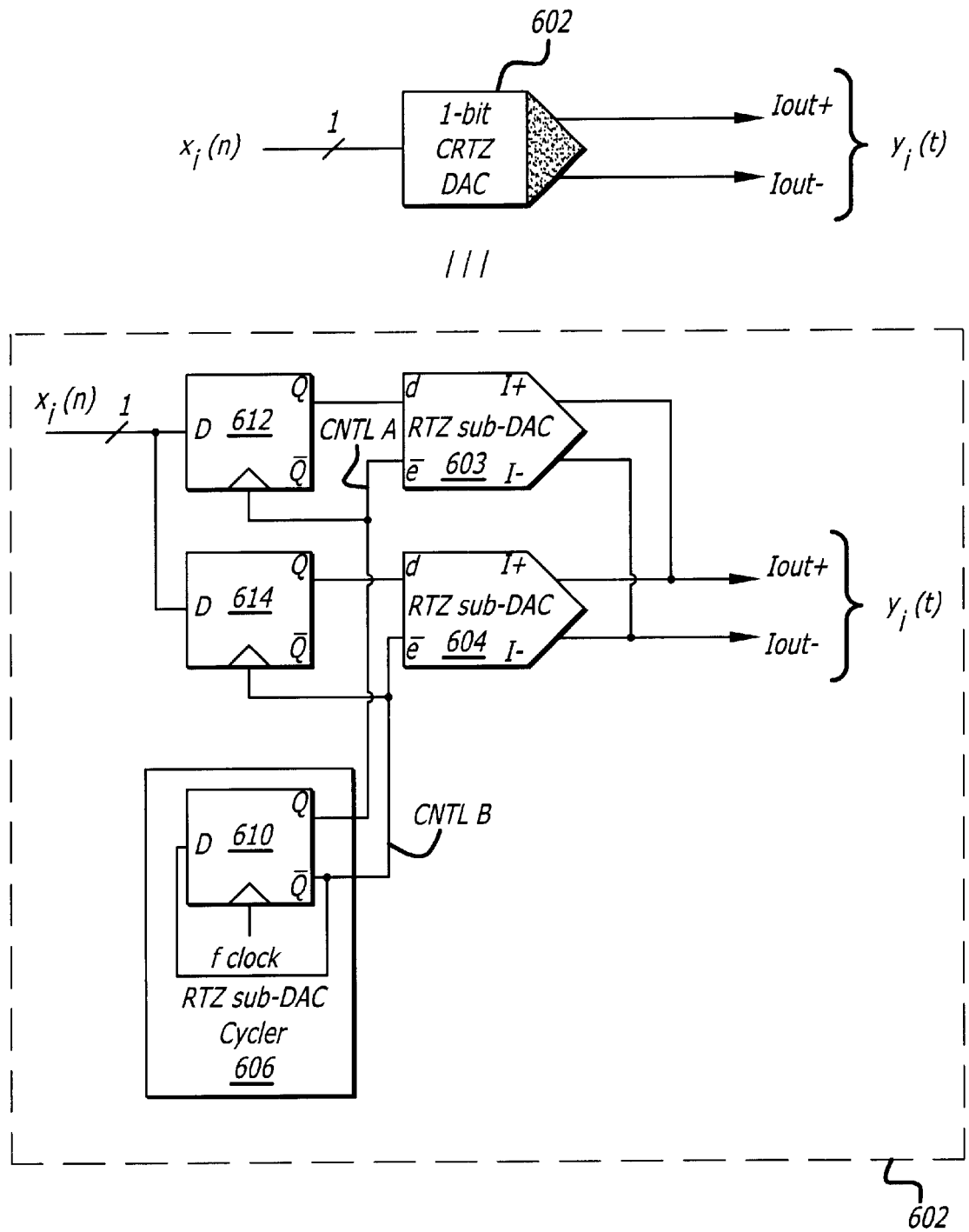
FIG. 6A is a block diagram illustrating an exemplary architecture for a cyclic return to zero (CRTZ) DAC to implement a basic CRTZ technique according to one embodiment of the invention.

FIG. 6A is a diagram illustrating an exemplary architecture for a one-bit cyclic return to zero (CRTZ) DAC 602 to implement a basic CRTZ technique according to one embodiment of the invention. It should be appreciated that this is only an example of an architecture for a one-bit CRTZ DAC to implement the basic CRTZ technique and that many other architectures are possible. In this embodiment, each one-bit CRTZ DAC 602 includes at least two RTZ signal generating circuits, e.g. one-bit RTZ sub-DACs 603 and 604, to perform digital to analog conversion and a cycler, e.g. an RTZ sub-DAC cycler 606, to cycle between the two RTZ sub-DACs. The RTZ sub-DAC cycler 606 cycles between the two one-bit RTZ sub-DACs 603 and 604 such that one of the RTZ sub-DACs performs digital to analog conversion for an entire sample period while the other RTZ sub DAC returns to approximately zero or other approximately constant value for the entire sample period. That is, the other RTZ sub-DAC is inactivated so that its output can return to approximately zero or other approximately constant value for the sample period or longer. It is to be understood that the value returned to can be nominally zero, approximately zero or can be some other nominally constant value or other approximately constant value to which the RTZ sub-DACs can return to when inactivated.

As shown in FIG. 6A, the RTZ sub-DAC cycler 606 can include a digital controller such as flip-flop circuitry 610 in a toggle configuration to enable or disable one of the RTZ sub-DACs 603 or 604 via control lines A or B. Other digital circuitry, e.g., D flip-flops 612 and 614, is also utilized in the architecture for the one-bit CRTZ DAC 602 for providing the one-bit data to the RTZ sub-DACs (i.e. from the Q output of the D flip-flop to the d input of the RTZ sub-DAC). The RTZ sub-DAC cycler 606 is clocked by $f_{clock}$. During each sample period (clocked by $f_{clock}$), the CRTZ sub-DAC cycler 606 enables one of the RTZ sub-DACs 603 or 604 via control lines A or B, respectively (e.g. with a logic low input into the enable bar input ($\bar{e}$) of the RTZ sub-DAC) or disables one of the RTZ sub-DACs via control lines A or B, respectively (e.g. with a logic high input into the enable bar input ($\bar{e}$) of the RTZ sub-DAC). If the RTZ sub-DAC is enabled, the enabled RTZ sub-DAC converts the input bit received from the respectively connected D flip-flop 612 or 614 to analog form using zero-order-hold interpolation (or an approximation thereof) for the entire sample period, while the other RTZ sub-DAC returns to zero for the entire sample period.

During the next period, the RTZ sub-DAC cycler 606 switches between the two RTZ sub-DACs 603 and 604 such that the RTZ sub-DAC that converted the input bit during the previous sample period returns to zero and the other RTZ sub-DAC that returned to zero during the previous sample period converts the input bit. In this fashion, each RTZ sub-DAC starts from zero when converting an input bit to analog form and utilizes an entire sample period. The differential analog output ($I_{out+}-I_{out-}$) of the RTZ sub-DAC 603 or 604 is an analog current that may, for example, be summed as part of a composite DAC. Moreover, it should be appreciated that the one-bit CRTZ DAC 602 can be implemented with any number of RTZ sub-DACs.

Figure 6B:
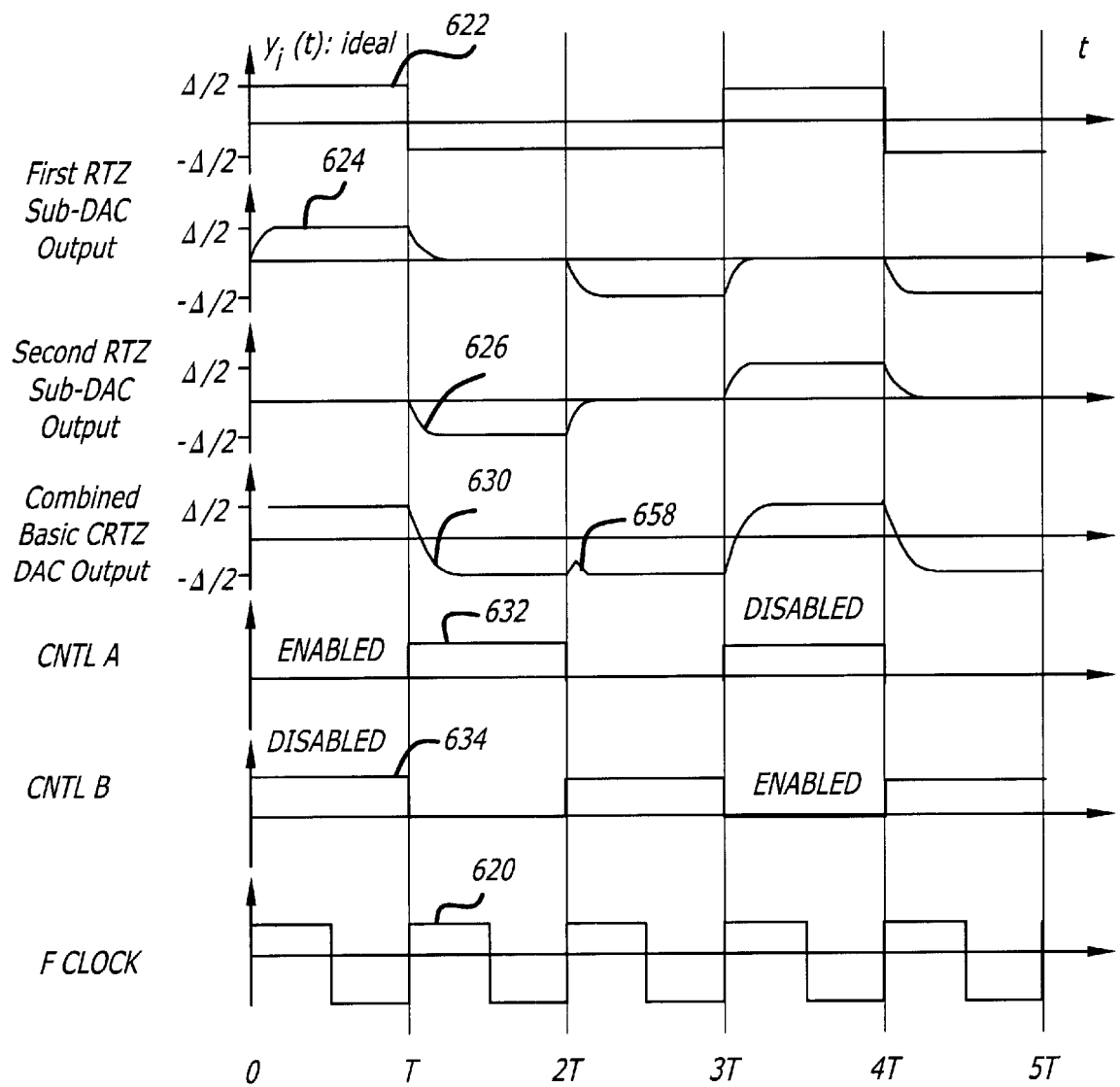
FIG. 6B is a waveform diagram illustrating an exemplary operation of the basic CRTZ technique according to one embodiment of the invention.

FIG. 6B is a waveform diagram illustrating an exemplary operation of the basic CRTZ technique according to one embodiment of the invention. FIG. 6B illustrates the basic method or operation of the basic CRTZ technique as it relates to the first and second RTZ sub-DACs previously discussed. However, it should be appreciated that the basic CRTZ technique is, in and of it itself, novel and unique, and can be implemented with various types of architecture.

Figure 1:
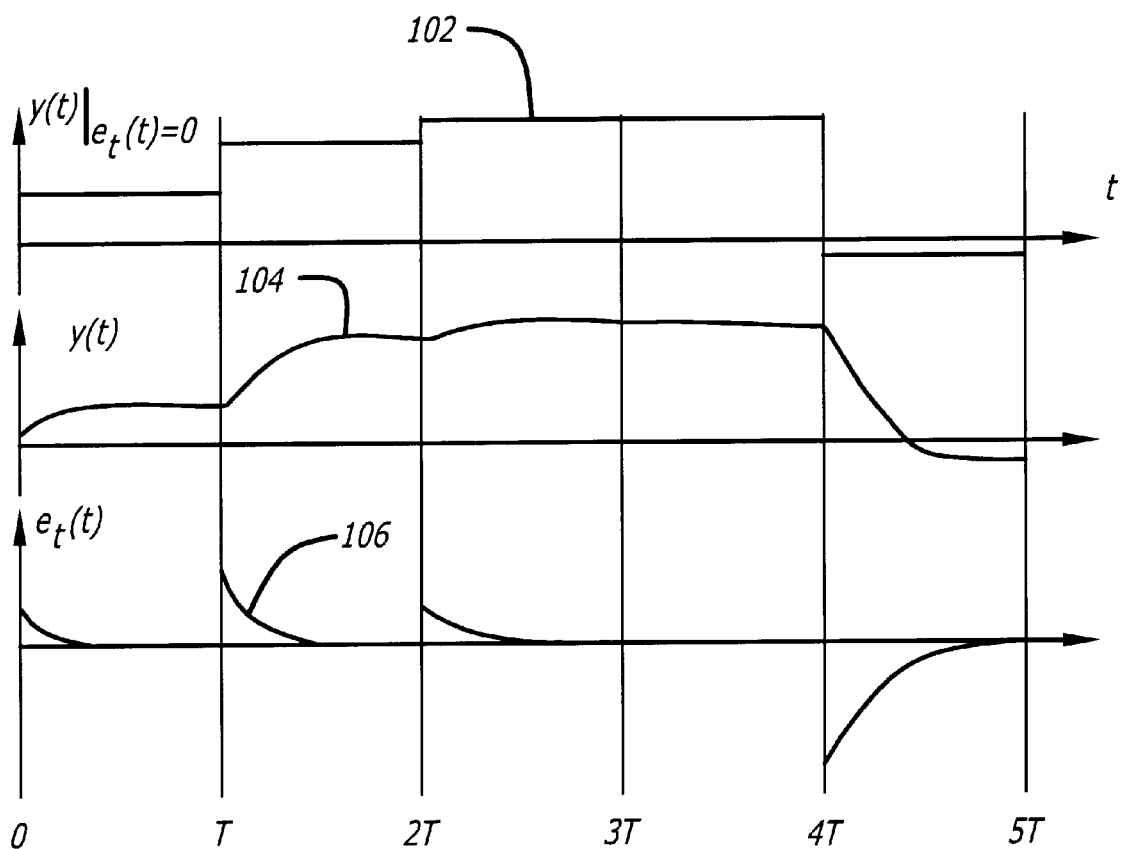
FIG. 1 is a waveform diagram showing representative continuous-time output waveforms from a digital to analog converter (DAC) with ideal zero-order-hold interpolation (top waveform), from a typical practical DAC (middle waveform), and the transient error associated with the practical DAC (bottom waveform).
Figure 2:
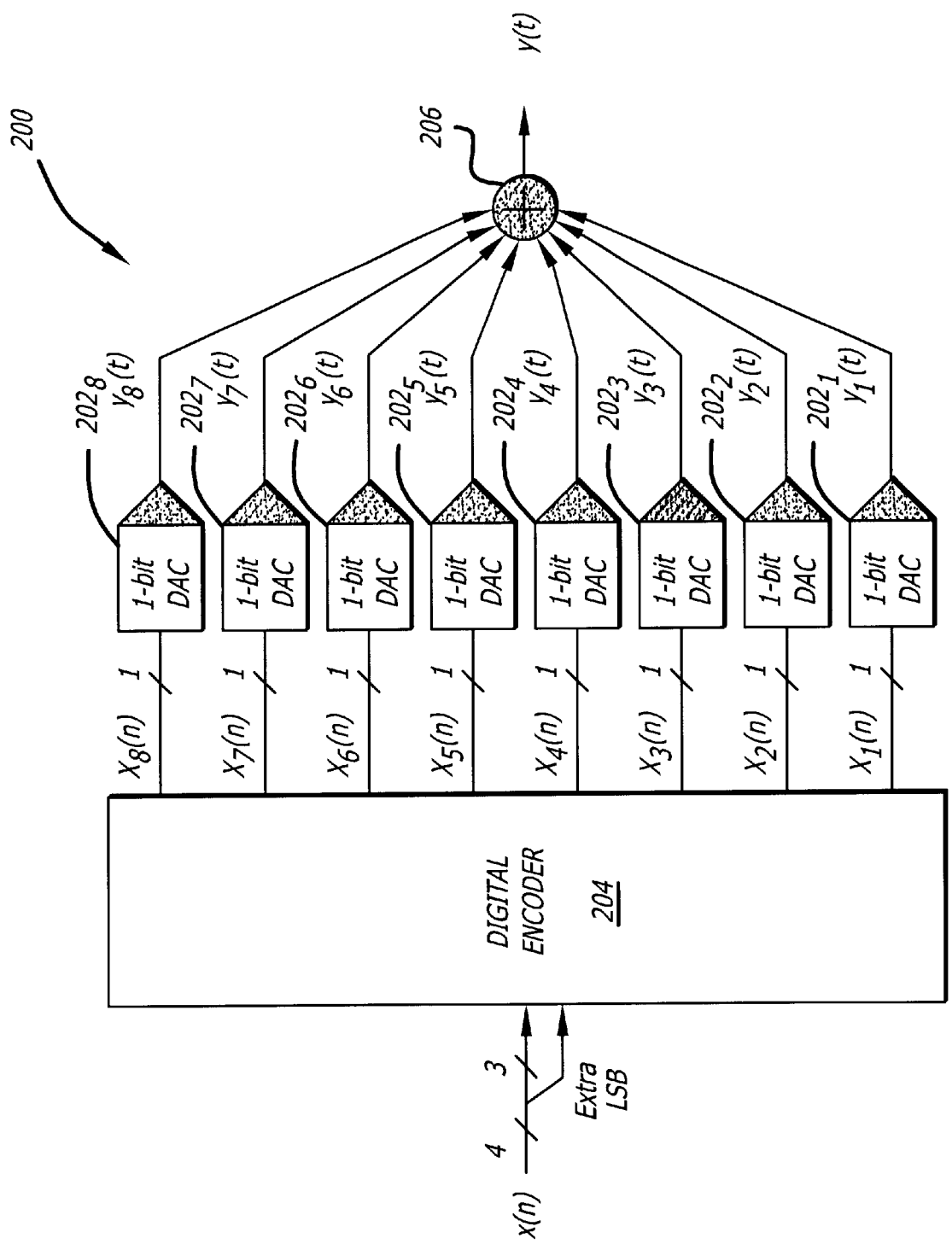
FIG. 2 is a block diagram illustrating an exemplary composite DAC comprising eight one-bit DACs.
Figure 3:
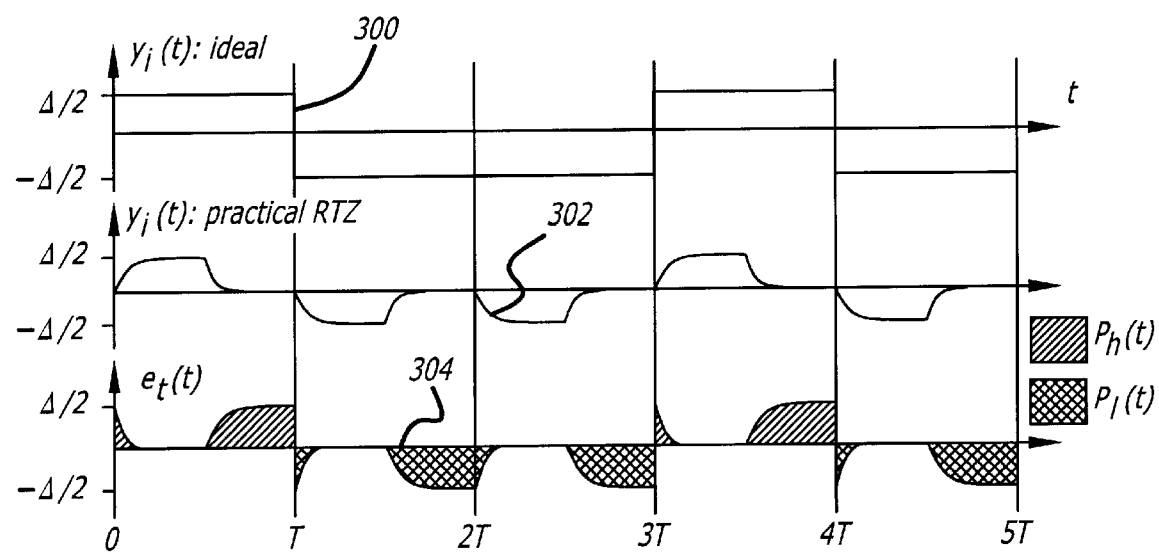
FIG. 3 is a waveform diagram showing representative continuous-time output waveforms from a digital to analog converter (DAC) with ideal zero-order-hold interpolation (top waveform), from a practical DAC utilizing return to zero (RTZ) interpolation (middle waveform), and the transient error associated with the practical RTZ DAC (bottom waveform).
Figure 4:
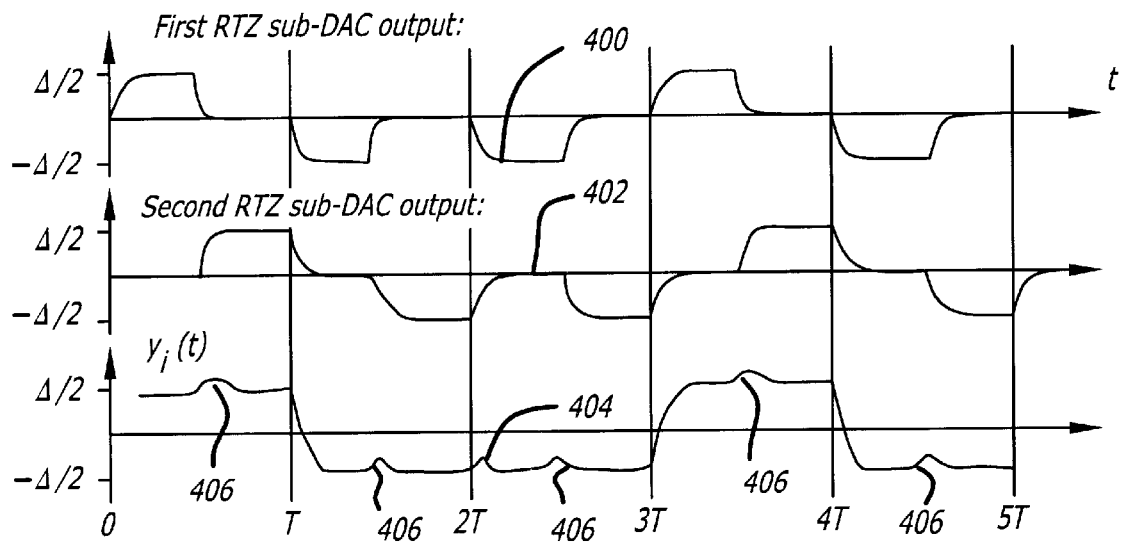
FIG. 4 is a waveform diagram showing representative continuous-time output waveforms from a pair of first and second interleaved RTZ sub-DACs utilizing a dual RTZ technique (top and middle waveforms, respectively) and their sum (bottom waveform).

FIG. 6B shows a set of waveforms all of which are drawn to the same time scale. Waveform 620 represents the clock signal. One period (i.e., T) is one cycle of the clock signal 620. Particularly, the basic CRTZ technique is a method for performing cyclic return to zero (CRTZ) digital to analog conversion of a digital input signal by generating at least two RTZ analog signals shown as waveforms 624 and 626, respectively, that when combined together approximate the ideal analog output signal $y_i(t)$ 622. The method cycles between the two RTZ signals 624 and 626 such that one of the RTZ signals is active over an entire sample period to convert a digital input bit into analog form while the other RTZ signal returns to zero for the entire sample period. During the next period, the cycling occurs between the two RTZ signals 624 and 626 such that the RTZ signal that was active during the previous sample period now returns to zero and the other RTZ signal that returned to zero during the previous sample period now becomes active. When the two analog RTZ signals 624 and 626 are summed, the combined waveform 630 results. The combined basic CRTZ output signal 630 is a low-distortion continuous-time analog output waveform approximating the ideal analog output signal $y^i(t)$ 622. Linear distortion in the middle of the periods is eliminated from the waveform 630 by the invention in comparison with the glitches 406 in waveform 404 of FIG. 4. However, the linear distortion at the beginning of a period may remain as represented by the glitch 658 in waveform 630.

As an example of the method implemented with the particular architecture 602 of FIG. 6A for a one-bit CRTZ DAC, each of the first and second RTZ sub-DACs 603 and 604 generate an analog output signal, the first and second RTZ analog signals 624 and 626, respectively, shown in FIG. 6B. The RTZ sub-DAC cycler 606 cycles between the first and second RTZ sub-DACs 603 and 604 such that one of the RTZ sub-DACs performs digital to analog conversion for an entire sample period while the other RTZ sub-DAC returns to zero for the entire sample period to yield the two RTZ analog signals shown as waveforms 624 and 626, respectively. The CNTL A and CNTL B waveforms 632 and 634 denote the RTZ sub-DAC cycler 606 enabling one of the RTZ sub-DACs 603 or 604 via control lines A and B, wherein a logic low input enables a respective RTZ sub-DAC and a logic high input disables a respective RTZ sub-DAC. If the RTZ sub-DAC is enabled, the enabled RTZ sub-DAC converts the input bit to analog form for the entire sample period yielding a corresponding RTZ analog signal, while the other RTZ sub-DAC returns to zero for the entire sample period. As previously discussed when the two analog RTZ signals 624 and 626 are summed, the combined basic CRTZ output signal 630 is produced that approximates the ideal analog output signal $y_i(t)$ 622.

Figure 7:
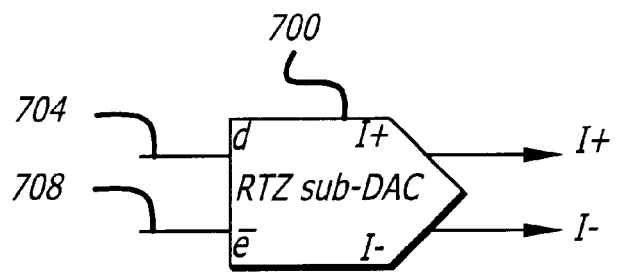
FIG. 7 is a schematic circuit diagram illustrating an exemplary RTZ sub-DAC.
Figure 7:
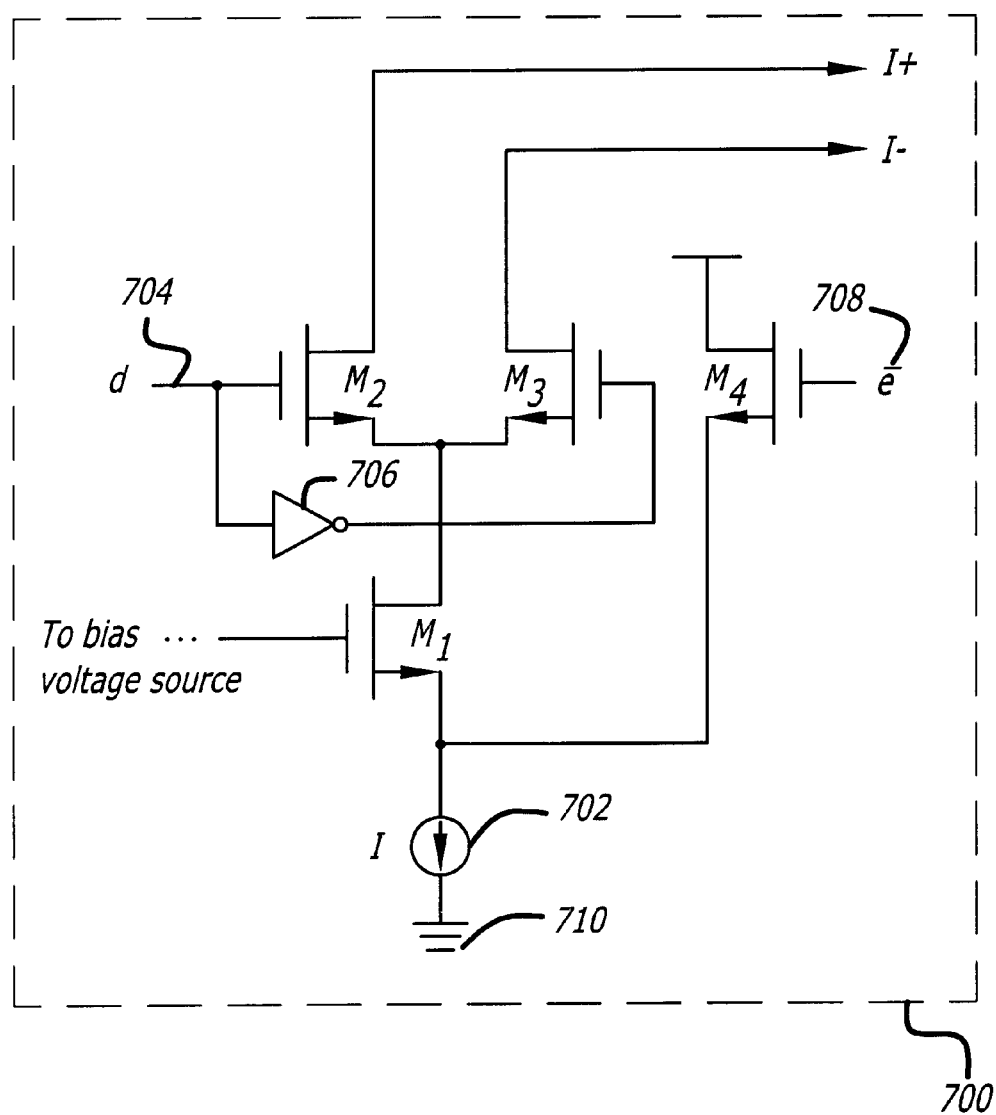

FIG. 7 is a schematic circuit diagram illustrating an exemplary RTZ sub-DAC 700. It should be appreciated that this is only one example of an RTZ sub-DAC that can be used with embodiments of the invention and that many other implementation are possible. The RTZ sub-DAC 700 has four transistors M1, M2, M3, and M4 (e.g. N-FET transistors), an inverter 706 and a current source 702 coupled together as shown in FIG. 7. Not shown in FIG. 7 is bias circuitry to apply a proper bias voltage to the gate of transistor M1. The RTZ sub-DAC 700 serves as a return to zero (RTZ) current signal generator. Transistors M2 and M3 operate as a current steering pair to steer tail current from current source 702 to output nodes ($I_{out+}$ and $I_{out-}$) depending on the input data from the d input 704. Transistor M2 is gated by the d input 704. Transistor M3 is gated by the inverse of the d input 704 provided by inverter 706. On the other hand, during the time period when the output current is meant to be shut off (i.e., the zero portion of the RTZ signal), transistor M4 is turned on by receiving a logic high input which increases the voltage at the source of M1 effectively turning it off. As a result, current of the current source is no longer supplied to either of the output nodes ($I_{out+}$ or $I_{out-}$) through transistors M2 or M3. Transistor M4 is gated by enable bar ($\bar{e}$) 708 (e.g. from the RTZ cycler). In this way, the current source 702 is always active avoiding problems that could result if it were switched on and off.

Figure 8A:
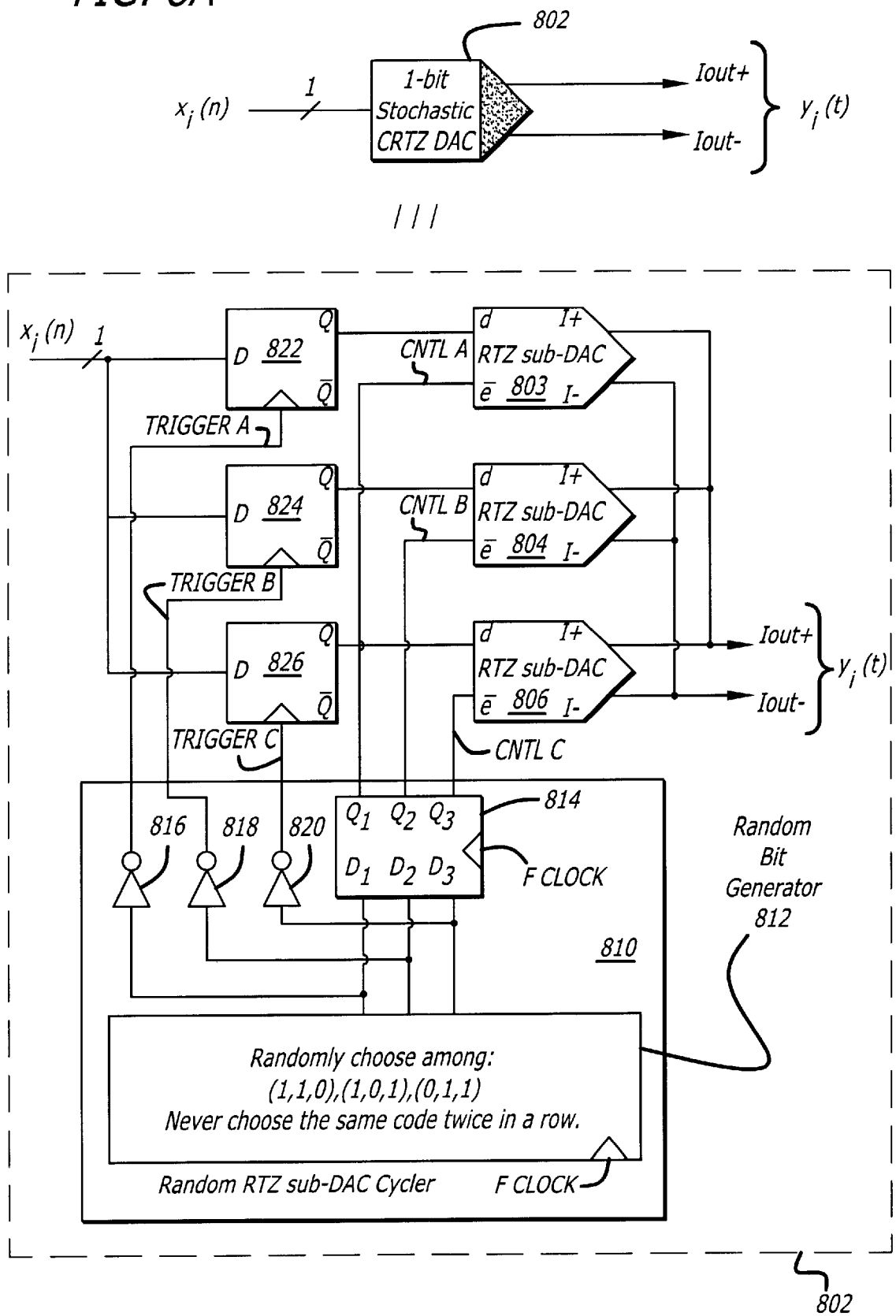
FIG. 8A is a block diagram illustrating an exemplary architecture for a stochastic CRTZ DAC to implement a stochastic CRTZ technique according to one embodiment of the invention.

FIG. 8A is a diagram illustrating an exemplary architecture for a stochastic CRTZ DAC 802 to implement a stochastic CRTZ technique according to one embodiment of the invention. It should be appreciated that this is only an example of an architecture for a stochastic CRTZ DAC to implement the stochastic CRTZ technique and that many other architectures are possible. In this embodiment, each one-bit stochastic CRTZ DAC 802 has at least three one-bit RTZ sub-DACs 803, 804, and 806 that are utilized in a random or pseudo-random fashion (throughout this document, the terms "random" and "pseudo-random" will be used interchangeably). For example, a random RTZ sub-DAC cycler 810 can be used to cycle between the three RTZ sub-DACs 803, 804, and 806 in a random fashion. Particularly, the random RTZ sub-DAC cycler 810 during each sample period selects between the three RTZ sub-DACs 803, 804, or 806 such that the RTZ sub-DAC that was used for digital to analog conversion in the previous sample period returns to zero and one of the other two RTZ sub-DACs is selected randomly to perform digital to analog conversion while the other RTZ sub-DAC remains at zero. The stochastic RTZ sub-DAC cycler 810 is clocked by $f_{clock}$.

As shown in FIG. 8A, in one embodiment, the stochastic RTZ sub-DAC cycler 810 can include a pseudo-random bit generator 812, a three-bit register 814, and three inverters 816, 818, and 820. The pseudo-random bit generator 812 randomly chooses among the following three bit codes: (1,1,0), (1,0,1), and (0,1,1) and never chooses the same code twice in a row. The three-bit register 814 randomly enables one of three RTZ sub-DACs 803, 804, or 806, while disabling the other two RTZ sub-DACs, based upon the three bit code via control lines A, B, or C. Other digital circuitry, the inverters 816, 818, and 820 and D flip-flops 822, 824, and 826, is also utilized in the architecture for the one-bit stochastic CRTZ DAC 802 to provide one-bit of input digital data to the RTZ sub-DACs (i.e. from the Q output of the respective D flip-flop to the d input of the respective RTZ sub-DAC).

As will be discussed, the D flip-flops 822, 824, and 826 are clocked by trigger bits (each trigger bit being the inverse of the corresponding bit of the D input to the register 814 (inverted by inverters 816, 818, and 820)), wherein each trigger bit is applied to the respective D flip-flop by trigger line A, B, or C, respectively, to clock the D flip-flop such that it selectively provides the one-bit data to an RTZ sub-DAC which is enabled. It should be noted that the output from a respective positive-edge triggered D flip-flop can change when a trigger bit switches from a logic low state to a logic high state thereby clocking the respective D flip-flop.

During each sample period (clocked by $f_{clock}$), the stochastic RTZ sub-DAC cycler 810 enables one of the one-bit RTZ sub-DACs 803, 804, or 806 via control lines A, B, or C, respectively (e.g. with a logic low input into the enable bar input ($\bar{e}$) of the RTZ sub-DAC) and disables the other two RTZ sub-DACs via control lines A, B, or C, respectively (e.g. with a logic high input into the enable bar input ($\bar{e}$) of the RTZ sub-DAC). Each of the one-bit RTZ sub-DACs either returns to zero or remains at zero for the entire sample period except for the enabled RTZ sub-DAC which converts the input bit received from the respectively connected D flip-flop 822, 824, or 826, to analog form using zero-order-hold interpolation (or an approximation thereof) during the sample period Particularly, the randomly selected codes (wherein the same code is never chosen twice in a row) of the stochastic RTZ sub-DAC cycler 810 ensure that during the nth sample period exactly one of the one-bit RTZ sub-DACs 803, 804, or 806 converts the input bit to analog form while the RTZ sub-DAC that converted the input bit during the previous sample period returns to zero and the other RTZ sub-DAC remains at zero during the nth sample period. During the next $(n+1)^{th}$ sample period, the stochastic RTZ sub-DAC cycler 810 (again based upon a randomly selected code) ensures that the RTZ sub-DAC that was used to convert the input bit to analog form during the previous sample period returns to zero, and exactly one of the other two RTZ sub-DACs is selected randomly to convert the input bit to analog form while the other RTZ sub-DAC remains at zero. In this fashion, each RTZ sub-DAC starts from zero when converting an input bit to analog form and utilizes an entire sample period. The differential analog output ($I_{out+}-I_{out-}$) of each RTZ sub-DAC 803, 804 or 806 is an analog current that may, for example, be summed as part of a composite DAC. Furthermore, the stochastic CRTZ technique advantageously reduces nonlinear distortion in the transient error even in the presence of mismatches among the one-bit RTZ sub-DACs in the one-bit stochastic CRTZ DAC 802. Moreover, it should be appreciated that the one-bit stochastic CRTZ DAC 802 can be implemented with any number of RTZ sub-DACs.

Figure 8B:
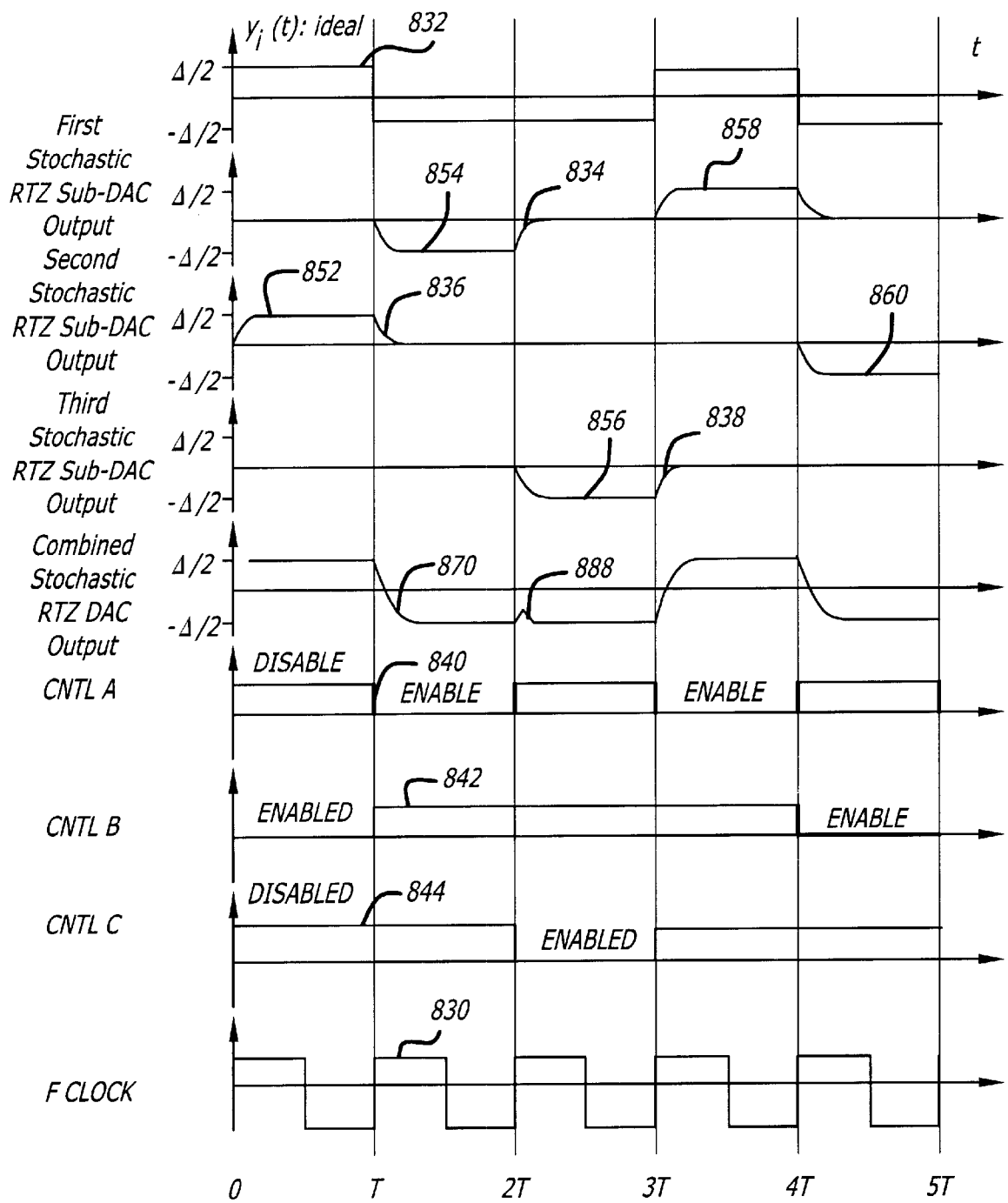
FIG. 8B is a waveform diagram illustrating an exemplary operation of the stochastic CRTZ technique according to one embodiment of the invention.

FIG. 8B is a waveform diagram illustrating an exemplary operation of the stochastic CRTZ technique according to one embodiment of the invention. FIG. 8B illustrates the basic method or operation of the stochastic CRTZ technique as it relates to the one-bit stochastic CRTZ DAC 802 previously discussed, however, it should be appreciated that the stochastic CRTZ technique is, in and of it itself, novel and unique, and can be implemented with various architectures.

FIG. 8B shows a set of waveforms all of which are drawn to the same time scale. Waveform 830 represents the clock signal. One period (i.e., T) is one cycle of the clock signal 830. The stochastic CRTZ technique provides a method for performing stochastic cyclic return to zero (CRTZ) digital to analog conversion of a digital input signal by generating at least three RTZ analog signals shown as waveforms 834, 836, and 838, respectively, in a random fashion and then combining them together to approximate the ideal analog output $y_i(t)$ 832. Linear distortion in the middle of the periods is eliminated from the waveform 870 by the invention in comparison with the glitches 406 in waveform 404 of FIG. 4. However, the linear distortion at the beginning of a period may remain as represented by the glitch 888 in waveform 870.

As an example of the stochastic CRTZ technique implemented with the particular architecture 802 of FIG. 8A for a stochastic CRTZ DAC, each of the first, second, and third RTZ sub-DACs 803, 804, and 806 generate an analog output signal, the first, second, and third RTZ analog signals 834, 836, and 838, respectively, shown in FIG. 8B. As previously discussed, during each sample period (clocked by $f_{clock}$), the stochastic RTZ sub-DAC cycler 810 enables one of the RTZ sub-DACs 803, 804, or 806 via control lines A, B, or C, respectively (e.g. with a logic low input into the enable bar input ($\bar{e}$) of the RTZ sub-DAC) and disables the other two RTZ sub-DACs via control lines A, B, or C (e.g. with a logic high input into the enable bar input (ē) of the RTZ sub-DAC). These signals are shown as the CNTL A, CNTL B, and CNTL C waveforms 840, 842, and 844, respectively. Moreover, when the one-bit RTZ sub-DAC is enabled, the enabled RTZ sub-DAC converts the input bit received from the respectively connected D flip-flop 822, 824, or 826, which is triggered by a respective trigger line A, B, or C. As will be discussed, the respective D flip-flop is clocked by trigger bits applied along a respective trigger line, when a trigger bit switches from a logic low state to a logic high state.

For example, assume that the pseudo-random bit generator 812 of the random RTZ sub-DAC cycler 810 randomly chooses the following three bit codes: (1,0,1); (0,1,1); (1,1, 0); (0,1,1); and (1,0,1). These randomly selected codes (subject to the constraint that no code is selected twice in a row) will now be discussed with reference to FIGS. 8A and 8B to more clearly describe the stochastic CRTZ technique. Starting with the random bits (1,0,1) as the Q-outputs of the three bit register 814 during period (0, T], these bits correspond to a logic low signal being sent along CNTL B (waveform 842) enabling the second RTZ sub-DAC 804 to convert the input bit received from D flip-flop 824 to generate RTZ waveform portion 852. At this point random bits (0,1,1) are at the input to register 814 which correspond to trigger bits (1,0,0) for trigger lines A, B, and C, respectively. Next, during period (T, 2T], with random bits (0,1,1) as the Q-outputs of register 814, these bits correspond to a logic low signal being sent along CNTL A (waveform 840) enabling the first RTZ sub-DAC 803 to convert the input bit received from D flip-flop 822 to generate RTZ waveform portion 854. At this point, random bits (1,1,0) are at the input to register 814 which correspond to trigger bits (0,0,1) for trigger lines A, B, and C, respectively, such that D flip-flop 826 is clocked (via trigger bit transition (1,0,0) to (0,0,1)) to provide the one-bit data to the third RTZ sub-DAC 806 which is enabled.

Continuing with the same example during period (2T, 3T], with random bits (1,1,0) as the Q-output of the three bit register 814, these bits correspond to a logic low signal being sent along CNTL C (waveform 844) enabling the third RTZ sub-DAC 806 to convert the input bit received from D flip-flop 826 to generate RTZ waveform portion 856. At this point, random bits (0,1,1) are input to register 814, which correspond to trigger bits (1,0,0) for trigger lines A, B, and C, respectively, such that D flip-flop 822 is clocked (via trigger bit transition (0,0,1) to (1,0,0)) to provide the one-bit data to the RTZ sub-DAC 803 which is enabled. Next, during period (3T, 4T], with random bits (0,1,1) as the Q-output of the three bit register 814, these bits correspond to a logic low signal being sent along CNTL A (waveform 840) enabling first RTZ sub-DAC 803 to convert the input bit received from D flip-flop 822 to generate RTZ waveform portion 858. At this point, random bits (1,0,1) input to register 814 which correspond to trigger bits (0,1,0) for trigger lines A, B, and C, respectively, such that D flip-flop 824 is clocked (via trigger bit transition (1,0,0) to (0,1,0)) to provide the one-bit data to the RTZ sub-DAC 804 which is enabled. During period (4T, 5T], with random bits (1,0,1) as the Q-output of the three bit register 814, these bits correspond to a logic low signal being sent along CNTL B (waveform 842) enabling the second RTZ sub-DAC 804 to convert the input bit received from D flip-flop 824 to generate RTZ waveform portion 860. Next, random bits (0,1,1) are input to register 814 which correspond to trigger bits (1,0,0) for trigger lines A, B, and C, respectively, such that D flip-flop 822 is clocked (via trigger bit transition from (0,1,0) to (1,0,0)) to provide the one-bit data to the first RTZ sub-DAC 803 which is enabled next.

When the three analog RTZ signals 834, 836, 838 are combined, the waveform 870 results. The combined basic CRTZ output signal 870 is a low-distortion continuous-time analog output waveform approximating the ideal analog output signal $y_i(t)$ 832. Furthermore, the stochastic CRTZ technique advantageously reduces nonlinear distortion in the transient error even in the presence of mismatches among the one-bit RTZ sub-DACs.

Figure 9:
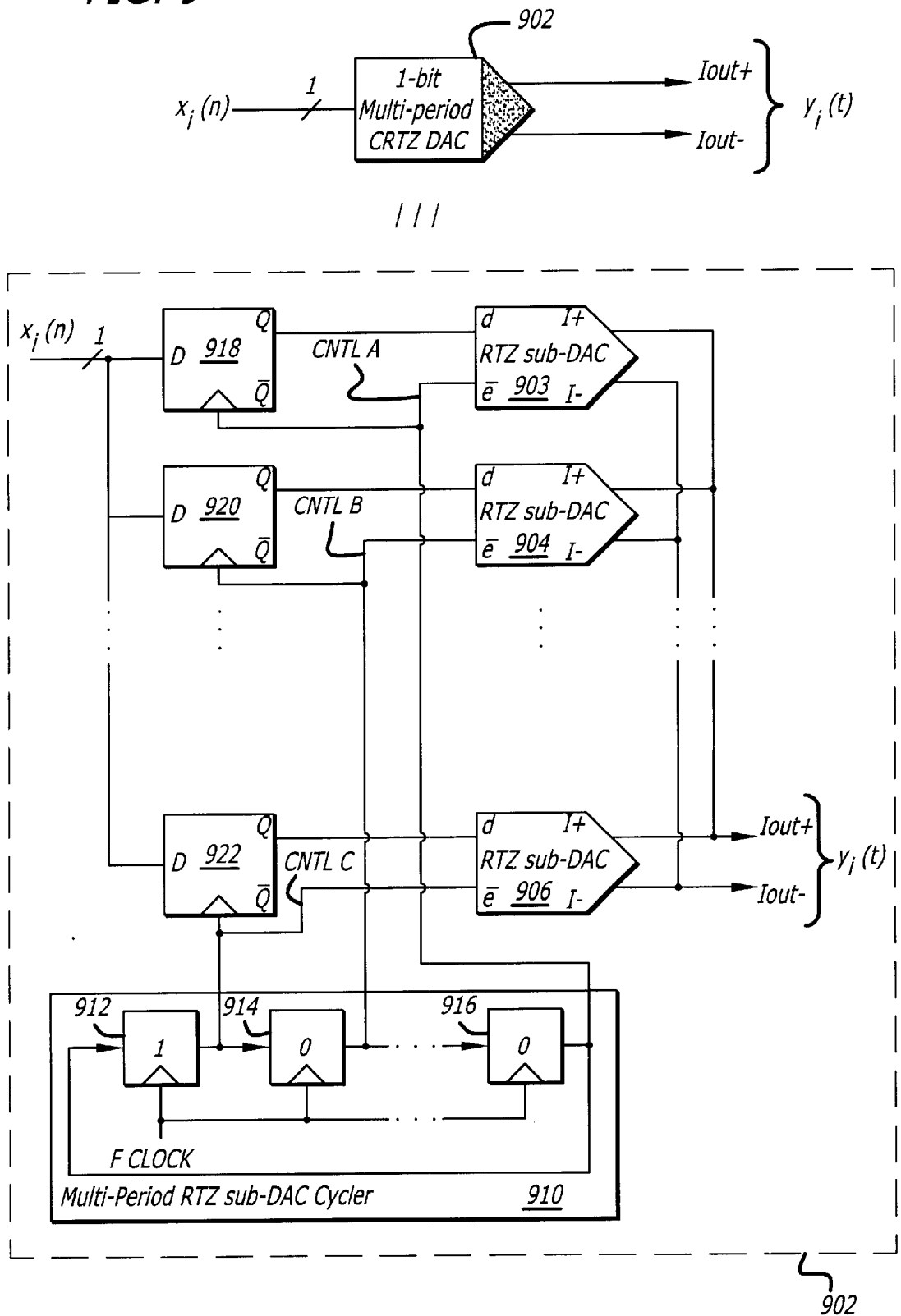
FIG. 9 is a block diagram illustrating an exemplary architecture for a multi-period CRTZ DAC to implement a multi-period CRTZ technique according to one embodiment of the invention.

FIG. 9 is a diagram illustrating an exemplary architecture for a one-bit multi-period CRTZ DAC 902 to implement a multi-period CRTZ technique according to one embodiment of the invention. It should be appreciated that this is only an example of an architecture for a one-bit multi-period CRTZ DAC to implement the multi-period CRTZ technique and that many other architectures are possible. In this embodiment, each one-bit multi-period CRTZ DAC 902 has at least three one-bit RTZ sub-DACs 903, 904, and 906 that are utilized in a multi-period fashion. However, it should be appreciated that any number of RTZ sub-DACs could be used. The multi-period CRTZ technique allows each RTZ sub-DAC 903, 904, and 906 to hold its output value for two or more sample periods before returning to zero. For example, a multi-period RTZ sub-DAC cycler 910 can be used to cycle between at least three RTZ sub-DACs 903, 904, and 906 such that the RTZ sub-DAC that was used to perform digital to analog conversion of the input bit from the previous sample period holds its previous value and one of the other two RTZ sub-DACs performs digital to analog conversion of the input bit from the current sample period while the other one of the two RTZ sub-DACs returns to zero.

As shown in FIG. 9, in one embodiment, the multi-period RTZ sub-DAC cycler 910 can include at least three flip-flops 912, 914, and 916 connected together in series with the output of the third flip-flop 916 connected back to the input of first flip-flop 912. Thus, the multi-period RTZ sub-DAC cycler 910 can be similar in form to an end-around-carry shift register or ring counter. Also, it should be appreciated that any number of flip-flops can be used. The three flip-flops 912, 914, and 916 are clocked by $f_{clock}$. The output of each of the three flip-flops 912, 914, and 916 is connected to the respective enable bar input of one of the RTZ sub-DACs via control lines A, B, or C. During each sample period, these control lines enable two of the RTZ sub-DACs (via logic low inputs (0)), and disable one of the RTZ sub-DACs (via a logic high input (1)). Other digital circuitry, e.g., D flip-flops 918, 920, and 922, is also utilized in the architecture for the one-bit multi-period CRTZ DAC 902 for providing the one-bit data to the RTZ sub-DACs (i.e. from the Q output of the D flip-flop to the d input of the RTZ sub-DAC). The multi-period RTZ sub-DAC cycler 910 is clocked by $f_{clock}$.

During each sample period (clocked by $f_{clock}$), the multi-period RTZ sub-DAC cycler 910 enables two of the RTZ sub-DACs 903, 904, or 906 via two of the control lines A, B, or C, respectively (e.g., each with a logic low input (0) into the enable bar input (ē) of the RTZ sub-DAC) and disables the other RTZ sub-DAC via one of the control lines A, B, or C, respectively (e.g., with a logic high input (1) into the enable bar input (ē) of the RTZ sub-DAC). When the two RTZ sub-DACs are enabled, one of the enabled RTZ sub-DACs initiates conversion of the input bit received from the respectively connected D flip-flop (the respective D flip-flop having been clocked previously by its clock input switching from a logic low to a logic high), to analog form using zero-order-hold interpolation (or an approximation thereof), while the other enabled RTZ sub-DAC continues to convert the input bit received from the respectively connected D flip-flop. The disabled RTZ sub-DAC returns to zero for the entire period.

Particularly, the multi-period RTZ sub-DAC cycler 910 ensures that during the $n^{th}$ sample period one of the RTZ sub-DACs 903, 904, or 906 converts the input bit to analog form while the RTZ sub-DAC that converted the input bit during the previous $(n-1)^{th}$ sample period continues to convert the input bit from the $(n-1)^{th}$ sample period and the third RTZ sub-DAC returns to zero. The differential analog output $(I_{out+}-I_{out-})$ which represents the combined output of the RTZ sub-DACs 903, 904 and 906 is an analog current that may, for example, be summed as part of a composite DAC. Holding the RTZ sub-DAC output values for more than one period produces a composite DAC output waveform that is equivalent to that from a composite DAC implemented with the basic CRTZ technique, previously described, followed by a particular linear lowpass filter. The frequency roll-off associated with the filtering operation can be beneficial in many applications. Alternatively a digital preemphasis filter may be inserted prior to a composite DAC 500 of the type shown in FIG. 5 except with each 1-bit CRTZ DAC replaced by a multi-period CRTZ DAC so as to compensate for the above mentioned roll-off. Additionally, optional requantization may be performed following the preemphasis filter so as to keep each input sample to the composite DAC within a desired numerical range.

As mentioned previously, and indicated by the ellipses shown in FIG. 9, it should be appreciated that the multi-period CRTZ DAC 902 can be implemented with any number of RTZ sub-DACs.

Combinations of the CRTZ techniques summarized above are readily apparent to those skilled in the art. For example, the multi-period CRTZ technique can be combined with the stochastic CRTZ technique. Similarly, the basic CRTZ technique can be varied by adding extra one-bit RTZ sub-DACs to each one-bit DAC so as to give each sub-DAC multiple sample periods in which to return to zero thereby reducing the speed at which the settling process must occur. Nevertheless, each of the CRTZ techniques outlined above and their variants are based on the idea of implementing a composite DAC of the type shown in FIG. 5 (without limitation to the number of one-bit DACs or their relative weightings) wherein each one-bit DAC consists of multiple one-bit RTZ sub-DACs and each input bit to the one-bit DAC is converted to analog form by one of the RTZ sub-DACs such that each sub-DAC always returns to zero for at least one sample period after converting an input bit.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for performing digital to analog conversion, comprising:
   generating at least two RTZ signals to perform digital to analog conversion; and
   cycling between the at least two RTZ signals such that one of the RTZ signals is active over at least an entire sample period to convert a digital input bit into analog form while others of the at least two RTZ signals return to approximately zero or other approximately constant value for at least an entire sample period.

2. The method of claim 1, wherein during a next sample period following a previous sample period, the cycling occurs between the at least two RTZ signals such that the one of the RTZ signals that was active during the previous sample period returns to approximately zero or other approximately constant value and another one of the at least two RTZ signals that returned to approximately zero or other approximately constant value during a previous sample period becomes active.

3. The method of claim 1, further comprising, combining the at least two RTZ signals.

4. The method of claim 3, wherein combining the at least two RTZ signals includes summing the at least two RTZ signals.

5. The method of claim 1, wherein the generating at least two RTZ signals to perform digital to analog conversion includes generating at least three RTZ signals.

6. The method of claim 5, wherein cycling between the at least three RTZ signals occurs in a random fashion.

7. The method of claim 6, wherein the cycling between the at least three RTZ signals in the random fashion occurs such that the one of the at least three RTZ signals that was active in a previous sample period returns to approximately zero or other approximately constant value and another one of the at least three RTZ signals is selected at random to become active while others of the at least three RTZ signals remain at approximately zero or other approximately constant value.

8. The method of claim 5, wherein cycling between the at least three RTZ signals occurs in a pseudo-random fashion.

9. The method of claim 8, wherein the cycling between the at least three RTZ signals in the pseudo-random fashion occurs such that the one of the at least three RTZ signals that was active in a previous sample period returns to approximately zero or other approximately constant value and another one of the at least three RTZ signals is selected in a pseudo-random fashion to become active while others of the at least three RTZ signals remain at approximately zero or other approximately constant value.

10. The method of claim 5, wherein cycling between the at least three RTZ signals occurs in a multi-period fashion such that each RTZ signal is active for at least two sample periods before returning to approximately zero or other approximately constant value.

11. The method of claim 10, wherein cycling between the at least three RTZ signals occurs in the multi-period fashion such that the one of the at least three RTZ signals that was active in a previous sample period holds its previous value and another one of the at least three RTZ signals becomes active while others of the at least three RTZ signals remain at approximately zero or other approximately constant value.

12. A digital to analog converter (DAC) to perform digital to analog conversion, comprising:
    at least two return to zero (RTZ) signal generating circuits to perform digital to analog conversion; and
    a cycler to cycle between the at least two RTZ signal generating circuits such that one of the RTZ signal generating circuits performs digital to analog conversion for at least an entire sample period while others of the at least two RTZ signal generating circuits return to approximately zero or other approximately constant value for the entire sample period.

13. The DAC of claim 12, wherein during a next sample period following a previous sample period, the cycler switches between the at least two RTZ signal generating circuits such that the one of the at least two RTZ signal generating circuits that performed digital to analog conversion during the previous sample period returns to approximately zero or other approximately constant value and another one of the at least two RTZ signal generating circuits that returned to approximately zero or other approximately constant value during the previous sample period performs digital to analog conversion.

14. The DAC of claim 12, wherein the at least two RTZ signal generating circuits are RTZ sub-DACs.

15. The DAC of claim 12, wherein the cycler is an RTZ sub-DAC cycler.

16. A digital to analog converter (DAC) to perform digital to analog conversion, comprising:
   at least two return to zero (RTZ) sub-DACs; and
   an RTZ sub-DAC cycler to cycle between the at least two RTZ sub-DACs such that one of the RTZ sub-DACs performs digital to analog conversion for at least an entire sample period while others of the at least two RTZ sub-DACs return to approximately zero or other approximately constant value for the entire sample period.

17. The DAC of claim 16, wherein during a next sample period following a previous sample period, the RTZ sub-DAC cycler switches between the at least two RTZ sub-DACs such that the one of the at least two RTZ sub-DACs that performed digital to analog conversion during the previous sample period returns to approximately zero or other approximately constant value and another one of the at least two RTZ sub-DACs that returned to approximately zero or other approximately constant value during the previous sample period performs digital to analog conversion.

18. The DAC of claim 16, wherein the RTZ sub-DAC cycler includes a digital controller.

19. The DAC of claim 16, wherein the digital controller includes flip-flop circuitry in a toggle configuration.

20. The DAC of claim 16, wherein the at least two RTZ sub-DACs is at least three RTZ sub-DACs.

21. The DAC of claim 20, wherein the RTZ sub-DAC cycler is a random RTZ sub-DAC cycler, the random RTZ sub-DAC cycler cycling between the at least three RTZ sub-DACs in a random fashion.

22. The DAC of claim 21, wherein the random RTZ sub-DAC cycler selects among the at least three RTZ sub-DACs such that the one of the at least three RTZ sub-DACs that was used to perform digital analog conversion in a previous sample period returns to approximately zero or other approximately constant value and another one of the at least three RTZ sub-DACs is selected randomly to perform digital to analog conversion while others of the at least three RTZ sub-DACs remain at approximately zero or other approximately constant value.

23. The DAC of claim 20, wherein the RTZ sub-DAC cycler is a random RTZ sub-DAC cycler, the random RTZ sub-DAC cycler cycling between the at least three RTZ sub-DACs in a pseudo-random fashion.

24. The DAC of claim 20, wherein the RTZ sub-DAC cycler is a multi-period RTZ sub-DAC cycler, the multi-period RTZ sub-DAC cycler cycling between the at least three RTZ sub-DACs such that each RTZ sub-DAC holds an output value for at least two sample periods before returning to approximately zero or other approximately constant value.

25. The DAC of claim 24, wherein the multi-period RTZ sub-DAC cycler selects among the at least three RTZ sub-DACs such that the one of the at least three RTZ sub-DACs that was used to perform digital analog conversion in a previous sample period holds its previous value and another one of the at least three RTZ sub-DACs performs digital to analog conversion while others of the at least three RTZ sub-DACs return to approximately zero or other approximately constant value.

26. A composite digital to analog converter (DAC) to perform digital to analog conversion, comprising:
   a plurality of cyclic return to zero (CRTZ) DACs, each CRTZ DAC including,
      at least two return to zero (RTZ) sub-DACs;
      an RTZ sub-DAC cycler to cycle between the at least two RTZ sub-DACs such that one of the RTZ sub-DACs performs digital to analog conversion producing an analog output voltage for at least an entire sample period while others of the at least two RTZ sub-DACs return to approximately zero or other approximately constant value for the entire sample period; and
   an adder to combine analog output voltages.

27. The composite DAC of claim 26, wherein during a next sample period following a previous sample period, the RTZ sub-DAC cycler switches between the at least two RTZ sub-DACs such that the one of the RTZ sub-DACs that performed the digital to analog conversion during the previous sample period returns to approximately zero or other approximately constant value and another one of the at least two RTZ sub-DACs that returned to approximately zero or other approximately constant value during the previous sample period performs digital to analog conversion.

28. The composite DAC of claim 26, wherein the RTZ sub-DAC cycler includes a digital controller.

29. The composite DAC of claim 26, wherein the digital controller includes flip-flop circuitry in a toggle configuration.

30. The composite DAC of claim 26, wherein each CRTZ DAC includes at least three RTZ sub-DACs.

31. The composite DAC of claim 30, wherein the RTZ sub-DAC cycler is a random RTZ sub-DAC cycler, the random RTZ sub-DAC cycler cycling between the at least three RTZ sub-DACs in a random fashion.

32. The composite DAC of claim 31, wherein the random RTZ sub-DAC cycler selects among the at least three RTZ sub-DACs such that the one of the at least three RTZ sub-DACs that was used to perform digital analog conversion in a previous sample period returns to approximately zero or other approximately constant value and another one of the at least three RTZ sub-DACs is selected randomly to perform digital to analog conversion while others of the at least three RTZ sub-DACs remain at approximately zero or other approximately constant value.

33. The composite DAC of claim 30, wherein the RTZ sub-DAC cycler is a random RTZ sub-DAC cycler, the random RTZ sub-DAC cycler cycling between the at least three RTZ sub-DACs in a pseudo-random fashion.

34. The composite DAC of claim 30, wherein the RTZ sub-DAC cycler is a multi-period RTZ sub-DAC cycler, the multi-period RTZ sub-DAC cycler cycling between the at least three RTZ sub-DACs such that each RTZ sub-DAC holds an output value for at least two sample periods before returning to approximately zero or other approximately constant value.

35. The composite DAC of claim 34, wherein the multi-period RTZ sub-DAC cycler selects among the at least three RTZ sub-DACs such that the one of the at least three RTZ sub-DACs that was used to perform digital analog conversion in a previous sample period holds its previous value and another one of the at least three RTZ sub-DACs performs digital to analog conversion while others of the at least three RTZ sub-DACs return to approximately zero or other approximately constant value.

36. A method for performing digital to analog conversion, comprising:
   generating at least three RTZ signals to perform digital to analog conversion; and
   cycling between the at least three RTZ signals such that one of the RTZ signals is active over at least an entire sample period to convert a digital input bit into analog form while others of the at least three RTZ signals are returned to approximately zero or other approximately constant value for at least an entire sample period.

37. The method of claim 36, wherein cycling between the at least three RTZ signals occurs in a random fashion.

38. The method of claim 36, wherein cycling between the at least three RTZ signals occurs in a pseudo random fashion.

39. The method of claim 36, wherein the cycling between the at least three RTZ signals in a random fashion occurs such that the one of the at least three RTZ signals that was active in a previous sample period returns to approximately zero or other approximately constant value and another one of the least three RTZ signals is selected at random to become active while others of the at least three RTZ signals remain at approximately zero or other approximately constant value.

40. A digital to analog converter (DAC) to perform digital to analog conversion, comprising:
   at least two signal generating circuits to perform digital to analog conversion; and
   a cycler to cycle between the at least two signal generating circuits such that one of the signal generating circuits is active to perform digital to analog conversion for at least an entire sample period while others of the at least two signal generating circuits are inactive.

41. The DAC of claim 40, wherein during a next sample period following a previous sample period, the cycler switches between the at least two signal generating circuits such that the one of the signal generating circuits that performed digital to analog conversion during the previous sample period is inactivated and another other one of the signal generating circuits that was previously inactive during the previous sample period is activated to perform digital to analog conversion.

42. The DAC of claim 40, wherein the at least two signal generating circuits are RTZ sub-DACs.

43. The DAC of claim 40, wherein the cycler is an RTZ sub-DAC cycler.

44. A digital to analog converter (DAC) to perform digital to analog conversion, comprising:
   at least three signal generating circuits to perform digital to analog conversion; and
   a cycler to cycle between the at least three signal generating circuits such that one of the signal generating circuits is active to perform digital to analog conversion for at least an entire sample period while others of the at least three signal generating circuits are inactive.

45. The DAC of claim 44, wherein during a next sample period following a previous sample period, the cycler switches from the active signal generating circuit that performed digital to analog conversion during the previous sample period to another one of the at least three signal generating circuits to perform digital to analog conversion.

46. The DAC of claim 44, wherein the at least two signal generating circuits are RTZ sub-DACs.

47. The DAC of claim 44, wherein the cycler is an RTZ sub-DAC cycler.

48. A digital to analog converter (DAC) to perform digital to analog conversion, comprising:
   at least three return to zero (RTZ) sub-DACs; and
   an RTZ sub-DAC cycler to cycle between the at least three RTZ sub-DACs such at one of the RTZ sub-DACs is active to perform digital to analog conversion for at least entire sample period while others of the at least three RTZ sub-DACs are inactive.

49. The DAC of claim 48, wherein the RTZ sub-DAC cycler is a random RTZ sub-DAC cycler, the random RTZ sub-DAC cycler cycling between the at least three RTZ sub-DACs in a random fashion.

50. The DAC of claim 48, wherein the RTZ sub-DAC cycler is a pseudo-random RTZ sub-DAC cycler, the pseudo-random RTZ sub-DAC cycler cycling between at least three RTZ sub-DACs in a pseudo-random fashion.

51. The DAC of claim 48, wherein the random RTZ sub-DAC cycler selects among the at least three RTZ sub-DACs such that the one of the at least three RTZ sub-DACs that was used to perform digital analog conversion in a previous sample period is deactivated and another one of the at least three RTZ sub-DACs is activated randomly to perform digital to analog conversion while others of the at least three RTZ sub-DACs remain inactive.

52. The DAC of claim 51, wherein the RTZ sub-DAC cycler is a multi-period RTZ sub-DAC cycler, the multi-period RTZ sub-DAC cycler cycling between the at least three RTZ sub-DACs such that each RTZ sub-DAC holds an output value for at least two sample periods.

53. The DAC of claim 52, wherein the multi-period RTZ sub-DAC cycler selects among the at least three RTZ sub-DACs such that the one of the at least three RTZ sub-DACs that was used to perform digital analog conversion in a previous sample period holds its previous value and another one of the at least three RTZ sub-DACs performs digital to analog conversion while others of the at least three RTZ sub-DACs are inactive.

* * * * *